(12) United States Patent
Fudoji et al.

(10) Patent No.: US 7,323,227 B2
(45) Date of Patent: Jan. 29, 2008

(54) PROCESS FOR PRECISE ARRANGEMENT OF MICRO-BODIES

(75) Inventors: Hiroshi Fudoji, Ibaraki (JP); Takeshi Konno, Ibaraki (JP); Mitsuru Egashira, Ibaraki (JP); Mikihiko Kobayashi, Ibaraki (JP); Norio Shinya, Ibaraki (JP)

(73) Assignee: Japan as Represented By Director General of National Research Institute of Metals, Ibaraki (JP)

( * ) Notice: Subject to any disclaimer, the term of this patent is extended or adjusted under 35 U.S.C. 154(b) by 0 days.

(21) Appl. No.: 11/349,985

(22) Filed: Feb. 9, 2006

(65) Prior Publication Data

US 2006/0231755 A1 Oct. 19, 2006

Related U.S. Application Data

(63) Continuation of application No. 10/793,896, filed on Mar. 8, 2004, now abandoned, which is a continuation of application No. 10/385,707, filed on Mar. 12, 2003, now abandoned, which is a continuation of application No. 10/128,489, filed on Apr. 24, 2002, now abandoned, which is a continuation of application No. 09/451,856, filed on Dec. 1, 1999, now abandoned.

(30) Foreign Application Priority Data

Dec. 1, 1998 (JP) .............................. 1998/342134

(51) Int. Cl.
*B05D 1/04* (2006.01)
(52) U.S. Cl. .................... 427/466; 427/469; 427/475
(58) Field of Classification Search ............ 250/491.1, 250/492.3; 204/484; 427/466, 469, 475
See application file for complete search history.

(56) References Cited

U.S. PATENT DOCUMENTS

| 4,733,074 | A |   | 3/1988  | Kato et al.                   |
|-----------|---|---|---------|-------------------------------|
| 5,060,191 | A | * | 10/1991 | Nagasaki et al. ........ 365/145 |
| 5,146,299 | A | * | 9/1992  | Lampe et al. ............ 257/295 |
| 5,770,123 | A | * | 6/1998  | Hatakeyama et al. ..... 264/1.21 |
| 6,010,831 | A | * | 1/2000  | Hatakeyama et al. ..... 430/323 |
| 6,835,317 | B2 | * | 12/2004 | Hatamura et al. ......... 216/11 |
| 7,223,444 | B2 | * | 5/2007  | Deppert et al. .......... 427/466 |

* cited by examiner

*Primary Examiner*—Robert Kim
*Assistant Examiner*—Johnnie L Smith, II
(74) *Attorney, Agent, or Firm*—Wenderoth, Lind & Ponack, L.L.P.

(57) ABSTRACT

A process for arranging a number of micro-bodies efficiently and precisely as one on one spot on a substrate.

Charged spots are formed by a converging ion beam or the like on a substrate having an insulating property or the like, and micro-bodies having a size of 200 microns or less are attracted and stuck to the charged spots.

10 Claims, 8 Drawing Sheets

Fig. 3
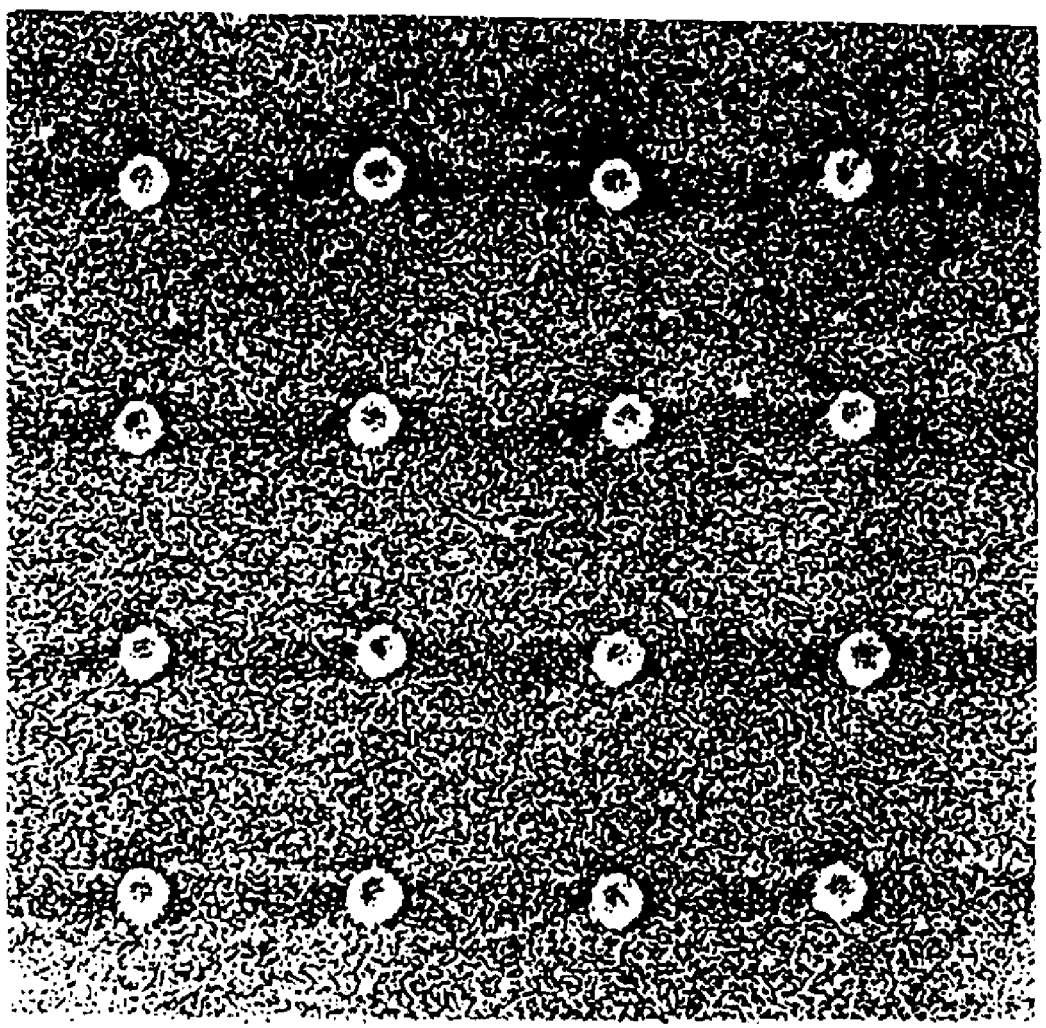
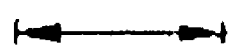
50μm

PROCESS FOR PRECISE ARRANGEMENT OF MICRO-BODIES

This application is a Continuation Application of Ser. No. 10/793,896, filed Mar. 8, 2004, now abandoned which is a Continuation Application of Ser. No. 10/385,707, filed Mar. 12, 2003, now abandoned, which is a Continuation Application of Ser. No. 10/128,489, filed Apr. 24, 2002, now abandoned, which is a Continuation Application of Ser. No. 09/451,856, filed Dec. 1, 1999, now abandoned.

BACKGROUND OF THE INVENTION

1. Field of the Invention

The present invention relates to a process for precise arrangment of micro-bodies. More particularly, the invention relates to a novel process for precise arrangment of micro-bodies, which is useful for finely working a precision machine or for integrating an electronic device. This process can arrange micro-bodies having a size of 400 microns or less, e.g., 200 microns, such as spacer particles in a liquid crystal device or the like, ball-grid-array particles in the packaging technical field of electronic parts, or minute parts in a semiconductor element or a micro-machine, precisely at target pin-point positions for a short time period.

2. Related Art

In the prior art, bodies or articles in the field governed by the gravity have been transferred to and arranged at predetermined positions by existing mechanical technique (such as the vacuum chucking method). It is, however, seriously difficult to apply such method to micro-bodies of 100 microns or less, for example, in the field governed by the surface force. On the other hand, the method of arraying the micro-bodies of small sizes are limited in number to the micro-pincette method, the laser manipulation method, the jet printing method and so on. According to these methods, however, the manipulations of the individual micro-bodies are not basically easy, which raise the working load, the working time period and the cost seriously. If the engineering application is considered, on the other hand, it is necessary to arrange many particles precisely. In the methods of the prior art, however, there arise problems that the arrangement takes an extremely long time period, and that the range of application is restricted.

SUMMARY OF THE INVENTION

In order to solve the above-specified problems, according to the invention, there is provided a process for precise arrangment of a micro-body, which process comprises: forming a charged spot on an insulating substrate; and attracting and sticking one micro-body to one charged spot.

In the process of the invention, further aspects are provided: the micro-body has a size of no more than 400 microns; the charged spot has a size of no more than 100 microns; the charged spot is polarized positive or negative in or out of contact; and a plurality of charged spots are formed, and one micro-body is attracted and stuck to each of the charged spots.

In the process of the invention, moreover: a positively charged spot smaller than a micro-body having a size of 1 to 200 microns or less is formed on the insulating substrate by a converging ion beam, and the micro-body is arranged on the charged spot; a negatively charged spot smaller than a micro-body having a size of 10 to 200 microns is formed on the insulating substrate by a converging electron beam, and the micro-body is arranged on the charged spot; a positively or negatively charged spot is formed on the insulating substrate by a discharge of a conductive microprobe having a leading end in or out of contact with the insulating substrate, and a micro-body having a size of 0.1 to 200 microns is arranged on the charged spot; and a multiplicity of charged spots are simultaneously formed by integrating microprobes into an array, and micro-bodies are arranged on the individual charged spots.

Alternatively, there is also provided a process for arranging a micro-body precisely, which process comprises: establishing a spot electric field by polarizing a substrate of a ferroelectric body voluntarily; and attracting and sticking one micro-body to the spot electric field.

BRIEF DESCRIPTION OF THE DRAWINGS

FIG. 3 is a photograph presenting an example of an array by micro particles;

DESCRIPTION OF THE PREFERRED EMBODIMENTS

Figure 1:
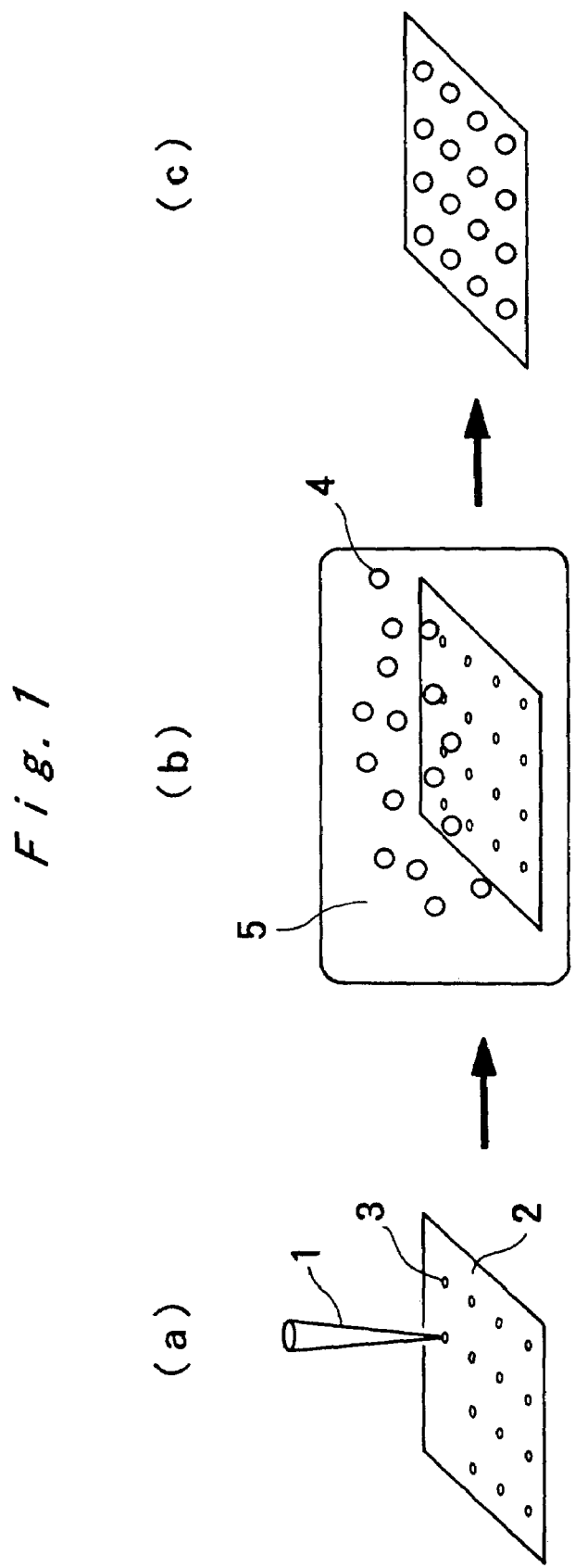
FIGS. 1a to 1c are diagrams showing the steps of a micro-body arraying process.

The invention has the aforementioned characteristics and can have remarkably high effects, however, it may further have various features as will be described in the following individual Examples. In the invention, for example, a converging ion beam capable of drawing multiple spots quickly and continuously is used to form positively charged spots smaller than target micro-bodies on an insulating substrate so that the particles can be precisely arranged as one partible on one spot and the multiple micro-bodies can be arranged at once. The merit coming from the use of the converging ion beam is that the multiple charged spots can be formed for a short time period and at precise positions.

When a converging electron beam is used in place of the converging ion beam, moreover, a scanning electron microscope or the like which is relatively in wide use can be utilized to lower the cost.

According to the invention, on the other hand, there is provided a micro-body arranging process wherein a positively or negatively charged spot is formed on a insulating substrate covered with an insulating film, in or out of the leading end of a conductive microprobe with the insulating substrate, and wherein a micro-body having a size of 0.1 to 200 microns is arranged on the charged spot. In place of the single probe to be scanned, however, the microprobe to be used herein is prepared by integrating the microprobes into an array to form the multiple charged spots simultaneously so that an array of multiple microbodies can be formed for a short time period. This process is advantageous in that it can be performed in the atmosphere, and is enabled to form the charged spots of nanometers by using the SPM (Scanning Probe Microscope).

The substrate is exemplified by the insulating substrate for keeping the charged spots. When the ferroelectric body is employed as the substrate, however, the orientation of voluntary polarization is arranged in place of the charging treatment. Specifically, the polarization phenomenon can be utilized to attract and stick the micro-bodies to the substrate by the electrostatic force generated by the polarized spots. The charges are released with the lapse of time so that the electrostatic force is weakened. However, the polarization is freed from such deterioration and can keep the electrostatic force for a long time.

In the process of the invention, more specifically, the charged spot pattern is formed on the insulating substrate or the ferroelectric substrate by the spot patterning of the converging electron beam or the microprobe. These charged spots have a size equal to or less than that of the target micro-bodies. These individual charged spots correspond one by one to the target micro-bodies. When there are introduced the singly dispersed particles which are charged with a polarity opposed to that of the charged spots, they are attracted to the charged spots or polarized spots on the substrate by the electrostatic force such as the electrophoretic force or the dielectric force so that one micro-body is stuck to one spot. The amount of charge of the charged spot is controlled according to the amount necessary for sticking one micro-body. In this charged spot, on the other hand, the magnitude of the electrostatic force takes the maximum at the center position of the spot so that the stuck position of the microbody is located at the center of the spot. As a result, the multiple micro-bodies can be arranged accurately and quickly on the substrate so that they can be precisely arranged.

Thus, the modes of embodiment of the invention will be described in more detail in connection with its Examples.

EXAMPLES

Example 1

FIG. 1 exemplifies a process using a converging ion beam. This process comprises three steps: (a) of forming charged spots 3 on a substrate 2 by a converging ion beam 1; (b) of feeding micro-bodies 4 onto the charged spots 3; and (c) of arranging the micro-bodies 4 on the charged spots 3.

At the first step (a), for example, the charged positive spots 3 were formed on the insulating substrate 2 of calcium titanate ceramics by using a Ga$^-$-converging ion beam at an acceleration voltage of 30 KV.

Figure 2:
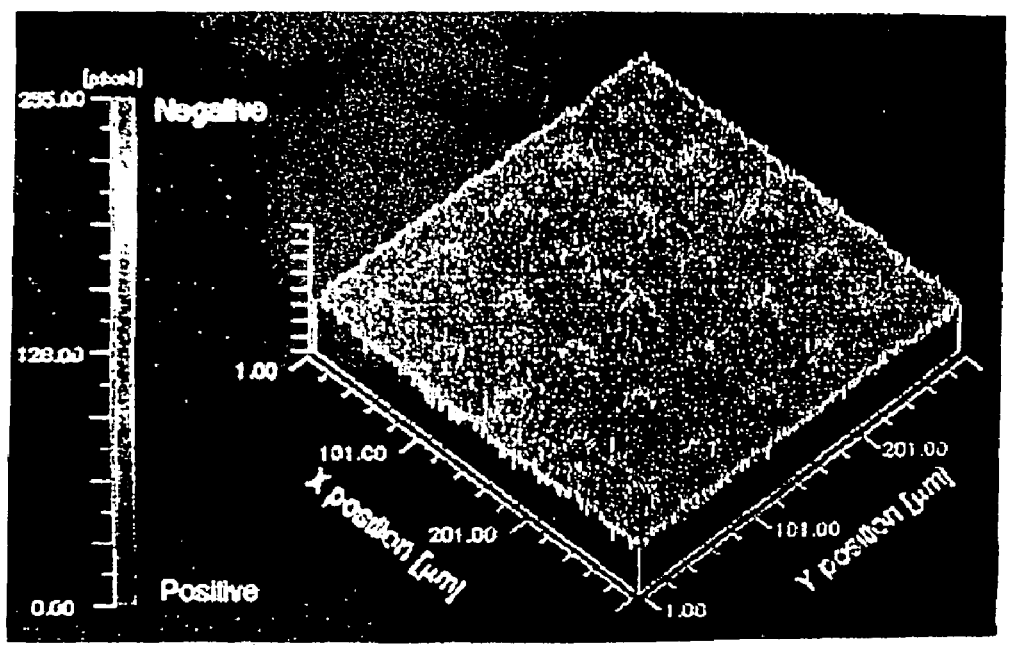
FIG. 2 is a diagram presenting a potential contrast image of charged spots.

FIG. 2 exemplifies an image of the charged positive spots having a size of 5 microns which were formed on the substrate charged at an interval of 50 microns. The observation was made as a secondary-electron contrast image by using a scanning electron microscope of a low acceleration voltage (of 2.5 KV).

At the next step (b), as the micro-bodies to be arranged, microbodies 4, which were made of simply dispersed metal-coated spherical polymer particles having a diameter of 10 microns and were dispersed in advance into an insulating solvent of fluorocarbon to prepare a suspension 5. Into this suspension 5, there was inserted the substrate 2 which had the charged spots 3 formed. The micro-bodies 4 were attracted to stick to the individual charged spots 3 by the electrostatic forces of the spots 3. At this time, the spots 3 and the micro-bodies 4 could be arranged to correspond to each other as one on one. At the last step (c), the substrate 2 was pulled out from the suspension 5, and the solvent was evaporated.

FIG. 3 shows one example in which the simply dispersed metal-coated spherical polymer particles having the diameter of 10 microns and were arranged as the micro-bodies on the charged spots formed, as shown in FIG. 2. FIG. 3 presents an optical microscopic image and confirms that vertically four and horizontally four and totally sixteen particles are arranged in a square lattice with interval of 50 microns from each other.

Example 2

Figure 4:
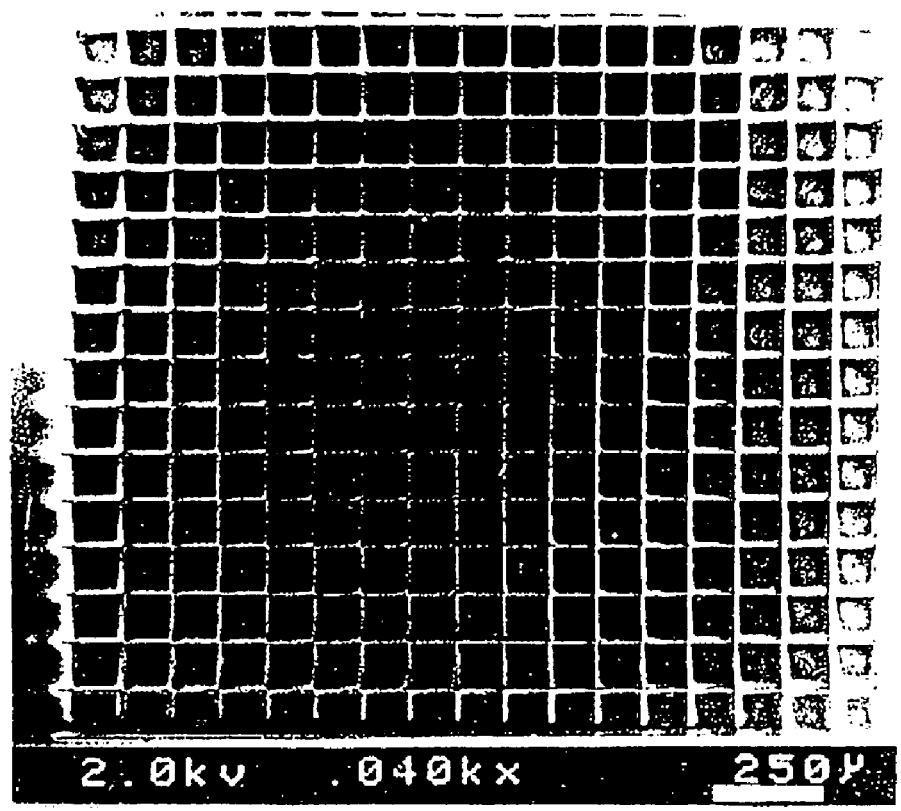
FIG. 4 is a photograph presenting a negatively charged pattern by a converging electron beam.

Negatively charged spots are to be formed if a minute charged pattern can be formed by using a converging electron beam in place of the converging ion beam at the step (a) of FIG. 1. It was, therefore, confirmed that the minute charged pattern could be formed on the insulating substrate of calcium titanate ceramics by using the converging electron beam. A lattice pattern of an interval of 100 microns was drawn by using the converging electron beam of an acceleration voltage of 15 KV. FIG. 4 presents an observation with a scanning electron microscope of an acceleration voltage of 2 KV, that is, a secondary-electron contrast image of the charged pattern. A white lattice contrast pattern of an interval of 100 microns was observed. This contrast pattern implies the charge with the negative polarity and had a line width of about 20 microns. It can be conceived from this result that the charged spots could be formed by using the converging electron beam to arrange the particles of 20 microns on the charged spots.

Example 3

Figure 5:
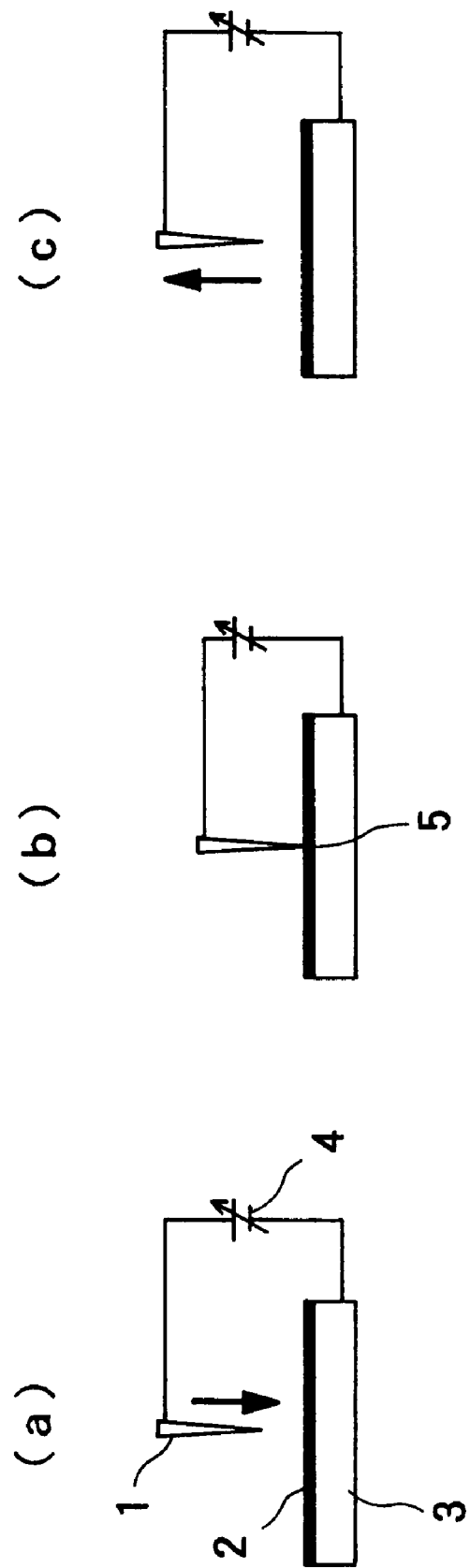
FIGS. 5a to 5c are diagrams showing the steps of an arraying process by a microprobe.
Figure 6:
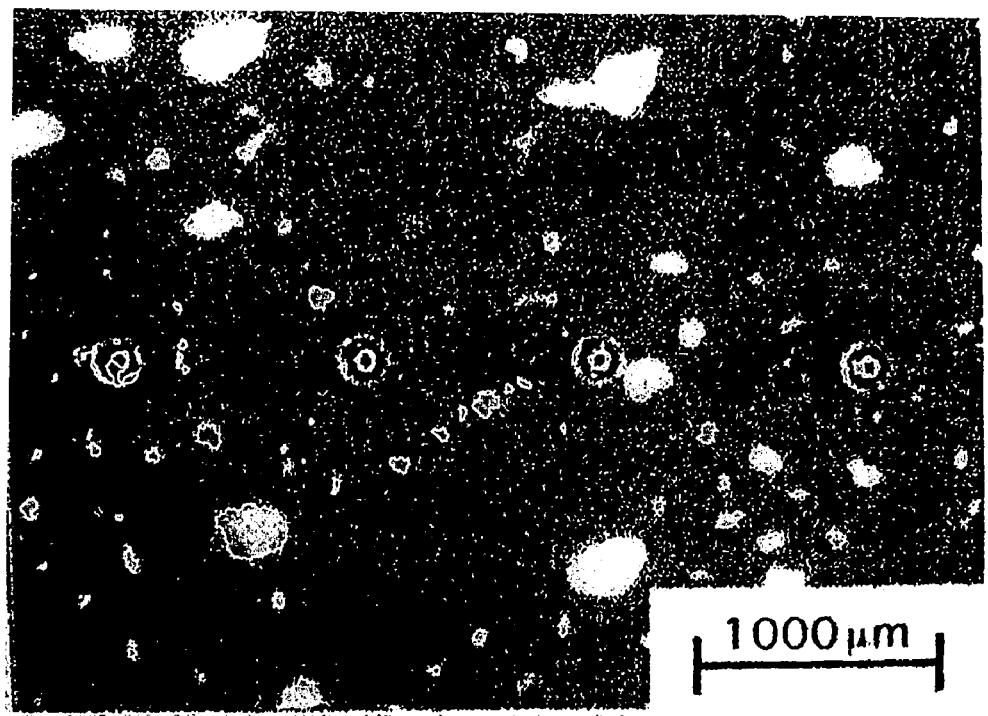
FIG. 6 is a photograph presenting an example of a particle array by a probe.

FIG. 5 shows a process for forming the charged spots by using a microprobe. In a construction comprising: a tungsten microprobe 1 (as will be abbreviated into the "probe") having a leading end diameter of 2 microns; a polytetrafluorethylene thin film 2 having a thickness of 50 microns; a glass substrate (as will be abbreviated into the "substrate") 3 treated to have a conductivity and a thickness of 1 mm; and a variable power supply 4 of rated 10 KV and 1 mA, the probe 1 was connected with the negative side of the power supply 4, and the substrate 3 was grounded to the earth. The thin film 2 was adhered to the substrate 3 by means of a conductive double-coated tape. At a first step a, therefore, the probe 1 was moved from a reference point on the substrate 3 to over a portion at which the charged spot was to be formed, and was so brought into contact with the thin film 2 that the thin film 2 might not be broken. At a next step b, the power supply 4 was used to apply a voltage of −1.5 KV between the probe 1 and the substrate 3 for three minutes. This applied voltage is set to such a level that the polytetrafluorethylene thin film 2 may not cause any dielectric breakdown. A region 5 in the thin film 2 is a charged spot formed by the probe 1. At a step c, the voltage between the probe 1 and the substrate 3 is released, and the probe 1 is separated from the thin film 2 and moved to a next spot position. Similar operations are repeated to form a spotted charged pattern. FIG. 6 presents an example in which simply dispersed glass particles having a diameter of 200 microns are arranged at an interval of 1 mm in the spotted charged pattern formed by using the probe.

Example 4

Figure 7:
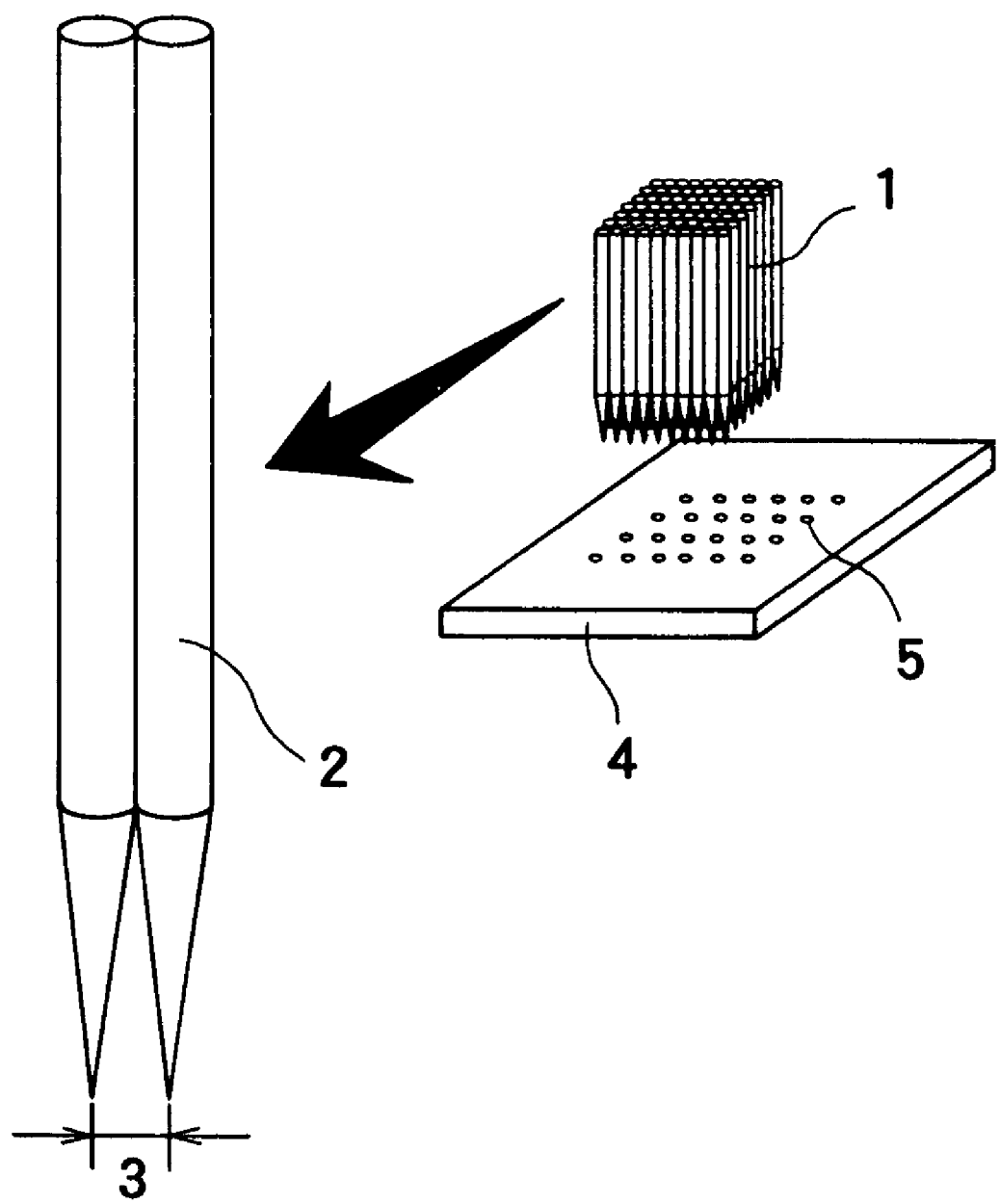
FIG. 7 is a diagram showing an integration of microprobes.

FIG. 7 shows one example in which the microprobes are integrated, that is, an integrated assembly 1 of microprobes and individual microprobes 2 constructing the integrated assembly 1. These microprobes 2 exhibit a tapered leading end and are arranged with an equal length and bundled into a square lattice. A distance 3 between the microprobes 2 corresponds to the diameter of the microprobes 2. On an insulating polymer foil 4, there are formed charged spots 5. These charged spots 5 are formed when the leading ends of the individual probes 2 come into contact. The interval between the individual charged spots is equal to the distance 3 between the microprobes. By selecting the diameter of the probes 2, therefore, the interval of the charged spots 5 can be selected at will.

Example 5

Figure 8:
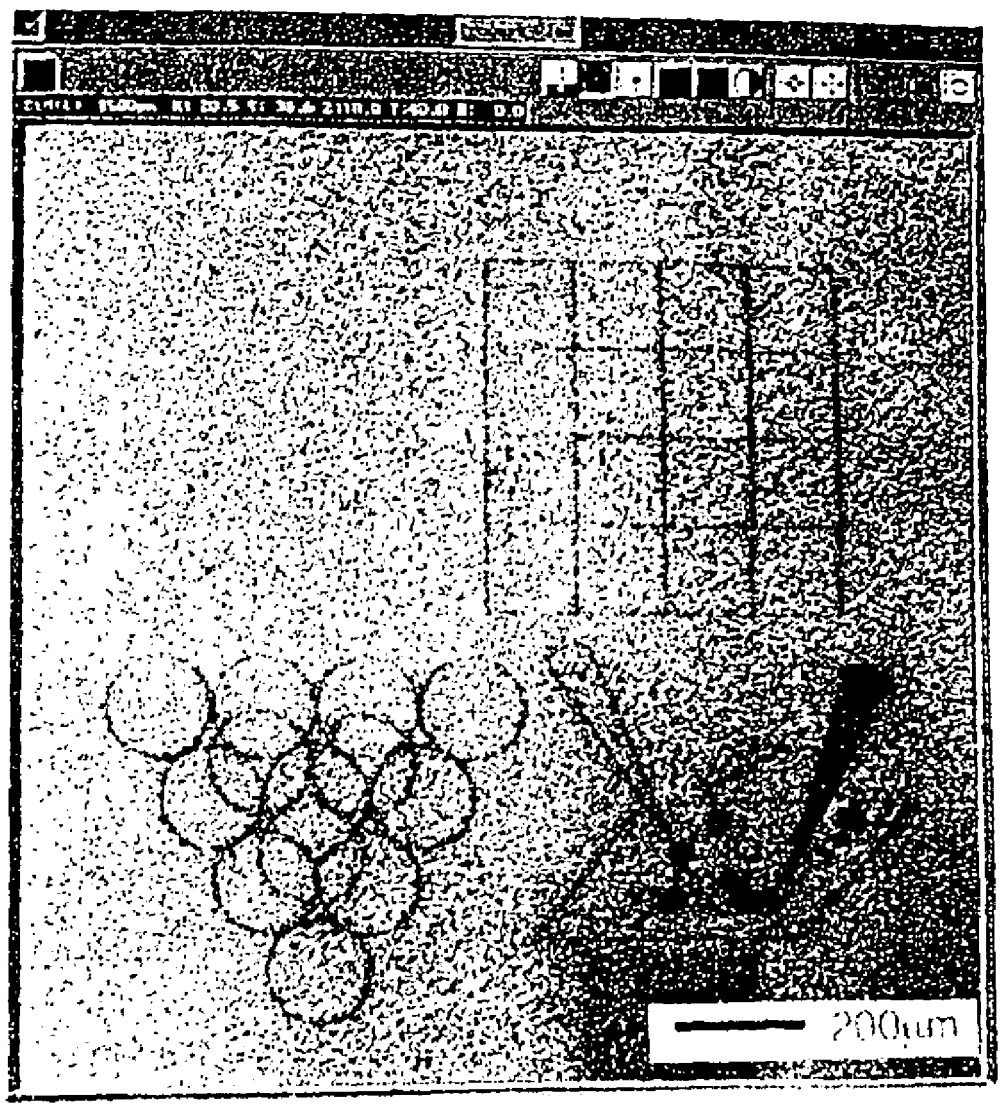
FIG. 8 is a photograph presenting an image drawn with a converging ion beam on a ferroelectric film.

FIG. 8 presents a trial of forming polarized spots by using a ferroelectric body in place of the insulating substrate. A fine pattern was drawn on a PZT ferroelectric substrate having a thickness of 30 microns by using a $Ga^+$-converging ion beam of 30 KV. The observation by the voltage contrast method using a scanning electron microscope of an acceleration voltage of 2.5 KV revealed that the region of the drawn pattern was positive. It is conceived that such an electric field was applied at the drawing time to the region irradiated with the converging ion beam as was sufficient for causing a voluntary polarization to generate polarized spots. It is, therefore, conceived that a fine pattern indicating a black contrast was due to the voluntary polarization. If the electrostatic force of the polarized spots is utilized, the micro-bodies can be precisely arranged as in the case of the charged spots.

According to the invention, as has been described in detail hereinbefore, when the converging ion beam is used, it is possible to form the minute charged spots and to arrange the micro-bodies precisely as one on one spot at designated positions. As with the converging ion beam, the minute charged pattern can be formed when the converging electron beam is used so that similar results with the converging ion beam can also be obtained with the converging electron beam. Even with the microprobe, on the other hand, one charged spot can be formed with one microprobe so that a number of charged spots can be formed for a short time period by integrating the microprobes.

When the ferroelectric body is used as the substrate, on the other hand, the spots irradiated with the converging ion beam or the converging electron beam are polarized to cause the voluntary polarization orientation so that the microbodies can be arrayed on the spots by making use of the electrostatic force of the polarized spots. These techniques can contribute to the packaging of electronic elements and can be expected in the future to develop to those for integrating sensors or devices.

What is claimed is:

1. A process for arranging a micro-body precisely, comprising: forming a positively or negatively charged spot on an insulating substrate; and attracting and sticking one micro-body to one charged spot by electrostatic force.

2. A process for arranging a micro-body precisely according to claim 1,
wherein said micro-body has a size of no more than 400 microns.

3. A process for arranging a micro-body precisely according to claim 1,
wherein said charged spot has a size of no more than 100 microns.

4. A process for arranging a micro-body precisely according to claim 1,
wherein said charged spot is polarized positive or negative in or out of contact.

5. A process for arranging a micro-body precisely according to claim 1,
wherein a plurality of charged spots are formed, and wherein one micro-body is attracted and stuck to each of said charged spots.

6. A process for arranging a micro-body precisely according to claim 1,
wherein a positively charged spot smaller than a micro-body having a size of 1 to 200 microns is formed on said insulating substrate by a converging ion beam, and wherein said microbody is arranged on said charged spot.

7. A process for arranging a micro-body precisely according to claim 1,
wherein a negatively charged spot smaller than a micro-body having a size of 10 to 200 microns is formed on said insulating substrate by a converging electron beam, and wherein said micro-body is arranged on said charged spot.

8. A process for arranging a micro-body precisely according to claim 1,
wherein a positively or negatively charged spot is formed on said insulating substrate by a discharge of a conductive microprobe having a leading end in or out of contact with said insulating substrate, and wherein a micro-body having a size of 0.1 to 200 microns is arranged on said charged spot.

9. A process for arranging a micro-body precisely according to claim 8,
wherein a multiplicity of charged spots are simultaneously formed by integrating micro-probes into an array, and wherein micro-bodies are arranged on the individual charged spots.

10. A process for arranging a micro-body precisely, comprising: establishing a spot electric field by polarizing a substrate of a ferroelectric body voluntarily; and
attracting and sticking one micro-body to said spot electric field by electrostatic force.

* * * * *